US006978424B2

(12) United States Patent
Safadi

(10) Patent No.: US 6,978,424 B2
(45) Date of Patent: Dec. 20, 2005

(54) VERSATILE USER INTERFACE DEVICE AND ASSOCIATED SYSTEM

(75) Inventor: Reem Safadi, Horsham, PA (US)

(73) Assignee: General Instrument Corporation, Horsham, PA (US)

( * ) Notice: Subject to any disclaimer, the term of this patent is extended or adjusted under 35 U.S.C. 154(b) by 565 days.

(21) Appl. No.: 09/976,314

(22) Filed: Oct. 15, 2001

(65) Prior Publication Data

US 2003/0071792 A1 Apr. 17, 2003

(51) Int. Cl.[7] .............................. G06F 3/00; H04N 5/44
(52) U.S. Cl. ...................... 715/765; 715/719; 715/864; 345/172; 725/152; 725/132; 725/37; 348/734
(58) Field of Search ............................... 345/719, 780, 345/172, 173, 168, 169; 715/762, 780, 733, 715/765, 866, 719, 864, 717, 718, 720, 721, 715/763, 771, 835; 348/734; 725/37, 131, 725/132, 151, 152; 719/328, 318, 331

(56) References Cited

U.S. PATENT DOCUMENTS 5,778,256 A * 7/1998 Darbee ........................ 710/72
5,889,506 A * 3/1999 Lopresti et al. ............. 345/158
5,956,025 A * 9/1999 Goulden et al. ............ 715/716

* cited by examiner

*Primary Examiner*—Raymond J. Bayerl
(74) *Attorney, Agent, or Firm*—Thomas Bethea, Jr.

(57) ABSTRACT

A versatile user interface device and associated system includes a consumer device, such as a set-top terminal, and a user interface device, such as a versatile remote control unit for sending command signals to the set-top terminal. The system enables application specific real-time programming of the remote control device. The system incorporates Versatile Remote Control Manager (VRCM) software that is invoked by the application via user selection. The VRCM enables application specific real-time re-mapping of the key code values for the operating keys of the remote control device, such as fixed keys and/or soft keys on a touch screen display device in order to enable simpler user interface interaction and navigation experience.

29 Claims, 2 Drawing Sheets

VERSATILE USER INTERFACE DEVICE AND ASSOCIATED SYSTEM

BACKGROUND OF THE INVENTION

1. Field of the Invention

The present invention generally relates to remote control devices and systems, and in particular to a versatile user interface device, such as a remote controller, suitable for use with a consumer device, such as a digital set-top terminal.

2. Descripton of Related Art

Over the past few decades, the availability of cable television (CATV) service to individual homes has increased dramatically. A number of different types of CATV communication systems have evolved to provide a broader array of CATV services. Conventional one-way CATV systems primarily provide video programming services, which are sent over the CATV physical link in a downstream direction, from the headend of a CATV system to a plurality of subscriber units.

Two-way CATV systems have become increasingly standard in the industry as the popularity and diversity of services or applications has grown, such as pay per view, interactive banking and home shopping. Two-way CATV system support both downstream and upstream communication. Accordingly, individual subscribers may communicate with the headend, other subscribers or service provider within the system. These systems also permit subscribers to select specific video programming or consumer services and pay only for those services that are used.

As digital set-top terminals become more of an application communication device, these set-tops enable various applications such as web browsing, video conferencing, games, home networking, device configuration, and the like. Because each application program has its own user interface and menu requirements, the customization of the functions of the remote control device to these applications will greatly simplify the user interface experience, hence providing the consumer with a more user-friendly means of interacting with the application.

One approach to customizing the remote control functions is to increase the number of keys to accommodate the different applications. However, this approach becomes impractical as the number of favorite applications increases.

Another approach to customizing the remote control function is to download Infrared (IR) codes, while others place the key selection menu on the display screen enabling the user to manipulate the up/down keys to select one of the entries on the selection menu. Unfortunately, these approaches do not meet the level of customization needed by a given customer.

The present invention addresses the shortcomings of conventional remote control devices and the application specific real-time programmability of such devices.

SUMMARY OF THE INVENTION

One aspect of the invention is to provide a remote control system that is capable of application specific real-time programming of the remote control device.

Another aspect of the invention is to provide a versatile remote control system that incorporates Versatile Remote Control Manager (VRCM) software that is invoked by the application via user selection to enable application specific real-time re-mapping of the key code values for the operating keys of the remote control device.

Namely, the versatile remote control system is made up of a versatile remote control unit that interfaces with a set-top terminal. The set-top terminal includes a central processing unit, memory, radio frequency (RF) communication devices, audiovisual decoding devices, etc. One or more applications may be resident in the set-top terminal. The versatile remote control unit includes fixed and/or soft keys on a touch screen display for sending control signals to the central processing unit of the set-top terminal to invoke and control at least one such application. A Versatile Remote Control Manager (VRCM) is resident in the set-top terminal, wherein the VRCM and associated Application Programming Interface Routines (API's) enable several functions, among them enabling a given application to re-map keys to correspond to the functions assigned by that application based on what the user's frequent key selection sequences. In an exemplary embodiment, a given application uses the VRCM and API's to designate an application specific function to a given key, or a series of key selections to a given key where these selections are frequently made by the user and the user instructs the application to perform this mapping. This mapping allows for subsequent application specific user interface interaction. In such an embodiment, each application maintains the new mapping and performs the associated functions according to the key selection.

For added user convenience, when the versatile remote control unit has an integrated display, a given application may use the VRCM and API's to download soft key graphical representations that are specific to the functions performed by this application and represent the individual key sequences that would otherwise have to be selected by the user for that specific function. These soft keys are displayed on the touch screen of the versatile remote control unit or a display device that is capable of facilitating similar remote control functionality.

DESCRIPTION OF THE PREFERRED EMBODIMENT

Figure 1:
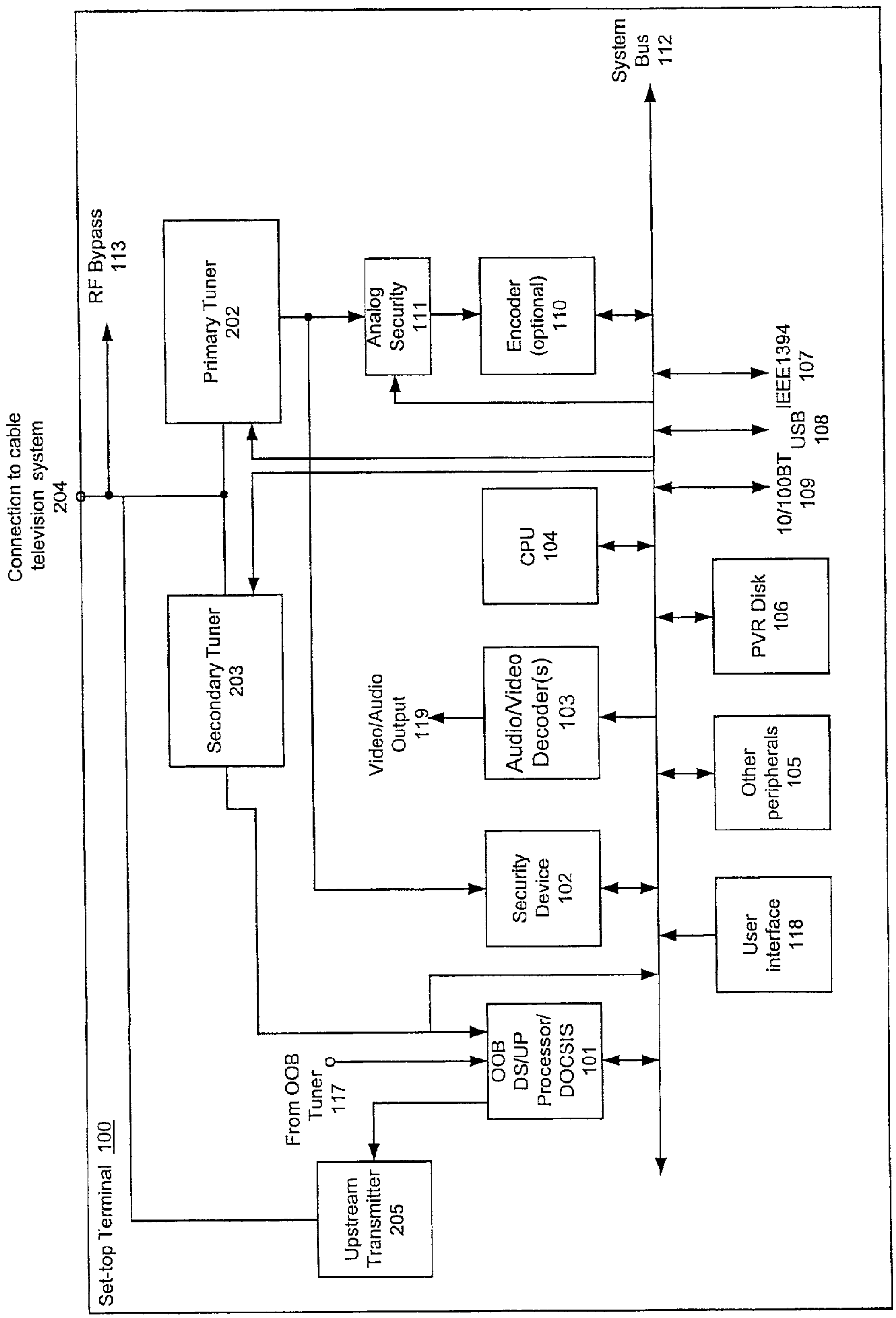
FIG. 1 is a block diagram of a set-top terminal of the present invention.

FIG. 1 shows a block diagram of a consumer device 100, such as a set-top terminal (STT) in accordance with the invention. The SST 100 includes a central processing unit (CPU) 104 that interfaces with a system bus 112. The central processing unit 104 includes both volatile and non-volatile memory to store digital information. Although a set-top terminal is described in the exemplary embodiment of the invention, it will be appreciated that the invention can be practiced with other consumer devices, such as a satellite receiver, television, and the like.

As shown in FIG. 1, the set-top terminal 100 of the present invention includes a primary tuner 202. The primary tuner 202 is preferably a broadband tuner that is used to tune a particular program offered over one of the hundreds of channels available from the cable system. The channel desired by the user is tuned using the primary tuner 202. If the television signal for that channel is an analog signal, it is then transmitted to the system bus 112 through an analog security circuit 111 for descrambling the signal, if the signal is scrambled, and, though an optional encoder 110 for hardware assisted compression. If the set-top terminal 100 is intended to process and record only digital programming, as analog transmission is phased out, the analog security 111 and the encoder 110 as illustrated are no longer necessary. Although, the encoder 110 may be retained for encoding other analog signals from alternate analog input sources for other applications.

The television programming received through the primary tuner 202 can be buffered and selectively recorded on the PVR disk 106 under the control of the central processing unit 104. This function is similar to that performed by personal video recorders (PVRs). The programming can also be decoded through the audio/video decoder 103 and provided to the video/audio outputs 119. The user's television set (not shown) is connected to one or more of that set of outputs 119, thereby allowing the user to watch the selected programming.

Additionally, other data may be embedded in the television signal received through the primary tuner 202. This data may include, for example, an HyperText Markup Language (HTML) file including a link with a universal resource locator (URL) that points to a web page associated with an advertisement, for example, being shown on the television channel to which the primary tuner 202 is tuned. The central processing unit 104 will preferably be running the necessary software to extract, display and record on the PVR disk 106 any such data. If the data includes a universal resource locator (URL), the CPU 104 can access and record the file to which the URL points for subsequent review by the user. This can be done without interrupting the television programming the user is watching.

Moreover, one or more channels to which the primary tuner 202 can tune may be dedicated to providing one or more data transport streams. These data transport streams can carry any type of data including any type of multi-media file, streamed audiovisual content or even application software, including player software optionally capable of contents right management that can be stored on the PVR disk 106 and executed by the CPU 104.

As shown in FIG. 1, the set-top terminal 100 also preferably includes a secondary tuner 203 that is also connected to the cable television system 204. The secondary tuner 203 is used primarily to tune to the data transport stream within the signal from the cable television system 204 to free the primary tuner 202 for more conventional tuning of a television channel the user wishes to receive. This secondary tuner 203 may operate in accordance with any multiple access modems that facilitate bidirectional communication between the device and the headend, for example, the Data Over Cable Service Interface Specification (DOCSIS) standard being used in this embodiment to acquire digital data. When the tuned signal facilitates bi-directional communication, for example by use of a DOCSIS signal, communication with the Internet can be readily achieved so that web content may be retrievable for caching or storing in the set-top terminal 100. As previously stated, this data may include any type of multi-media content in a variety of formats. The data transport stream from the DOCSIS tuner 203 is provided to a DOCSIS modem 101. The DOCSIS modem 101 communicates with the CPU 104 over the system bus 112.

The second purpose of the secondary tuner 203 is to optionally allow for the respective recording and watching of separate audiovisual programming offered at two distinct frequencies, i.e., on different channels, or from different sources, i.e. streamed audiovisual content from the Internet and broadcast television programming. The secondary tuner 203 can also be used in conjunction with the primary tuner 202 to simultaneously watch two different television channels or audiovisual data streams in a picture-in-picture mode. Consequently, the two-tuner configuration allows for, inter alia, the following operating modes of interest:

1) Watching an analog channel, recording a digital program (encrypted or in the clear);
2) Watching a clear digital program and recording a digital program (encrypted or in the clear);
3) Watching an encrypted program and recording an analog channel or a second digital program in the clear; and
4) Watching picture-in-picture, where the first signal is received from the primary tuner while the second is played back or retrieved from the PVR disk 106.

When involving an encrypted MPEG-2 stream, the stream goes through the security device 102 for decryption first and then, if the decrypted signal is to be watched (instead of being recorded), it is processed by the decoder 103. The content may also be encrypted using alternate software assisted techniques in which a second decryptor may not be required.

Digital data, multimedia files and application software can also be transmitted to the set-top terminal over the cable television system on an out-of-band (OOB) control channel 117. Although for bandwidth capacity considerations, the in-band (primary tuner) or the secondary tuner are more suitable. An OOB data channel is utilized primarily to facilitate conditional access functions for traditional and emerging services offered by the cable system operator as described in the prior art.

However received, compressed audiovisual content may then be recorded on the PVR disk 106. If the audiovisual data is streamed, e.g. web-cast, recording that data on the disk 106 may be done for caching purposes (subsequent use by the application software on a dynamic basis) or permanently stored. Additionally, the audiovisual signal recorded on the disk 106 can be retrieved and processed through the audio/video decoder 103 and then provided to the video/audio outputs 119 of the set-top terminal 100. The user's television set (not shown) is connected to the video/audio outputs 119 and, consequently, receives the output signal so that the user can then watch the recorded audiovisual programming.

Additionally for bidirectional communication, an upstream transmitter 205 is provided in connection with the DOCSIS modem 101. The DOCSIS modem 101 incorporates an upstream processor that drives the transmitter 205 to facilitate upstream DOCSIS transmission, as well as, to support existing report-back protocols 101 used to manage the cable television system. The DOCSIS modem 101 thus provides bi-directional communication for Internet access, user requests of web pages, files, session requests, purchase requests, etc.

Control lines to the primary tuner 202 and the secondary DOCSIS tuner 203 are provided from the system bus 112. This allows the user to input tuning commands to the system using a user interface 118 so as to control the channel tuned by the primary tuner 202. The connection to the DOCSIS tuner 203 allows the CPU 104 to control which data stream is provided to the DOCSIS modem 101 where there are multiple data transport streams comprised within the signal from the cable television system 204.

The set-top terminal 100 may also provide an agent application. The agent is a software application, i.e., a piece of software, executed by the central processing unit 104 to automatically select and record audiovisual programming and data desired by the user as specified by parameters input by the user. For example, the agent application may monitor an electronic programming guide for television programming of interest to the user based on user-input parameters. The agent may then automatically record this programming on the PVR disk 106 for subsequent review by the user.

The agent application may also monitor and/or retrieve from Internet servers any data of interest to the user based on user-input parameters. This data may include, but is not limited to, broadcast HTML pages accompanying an audio-visual advertisement or program, news files, health reports, electronic program guides, web-casts and any other data source for multimedia data that meets criteria indicated by the user. The agent application then automatically tunes and records, or acquires and caches the programming or data for later review by the user. For example, the stored advertisement HTML page may include a URL for the advertiser, where the user may get additional information at his/her convenience about the advertised product of interest without disrupting the current program viewing.

The user interface 118 allows the user to interact with and control the set-top terminal 100. For example, the interface preferably includes, for example, an application executed by the central processing unit 104 that provides display menus which can be navigated using a remote control unit (as part of the interface 118). With the user interface 118, the user is able to input commands to corresponding applications running on the central processing unit 104 to control, for example, the current or future recording of the incoming television signal from the primary tuner 202, select the desired web content to be downloaded (news, weather updates, etc.), or select other operations or set other parameters associated with an agent application.

In addition to the primary elements described above, the set-top terminal 100 of the present invention may also include a number of other features. For example, an RF bypass 113 offered by traditional set-top devices allows direct signal routing to the connected television set or a video cassette recorder.

Additionally, in order to interface the set-top terminal 100 of the present invention with other devices and systems, a number of additional interfaces may be provided. For example, to interface a digital camera for multimedia mail applications, an IEEE1394 digital bus 107 or a Universal Serial Bus (USB) 108 may be utilized. To transfer the files to a near by PC, a 10/100BT interface 109, and the like, may be utilized. Connections to other peripherals 105, such as a printer and the like, are also shown.

Figure 2:
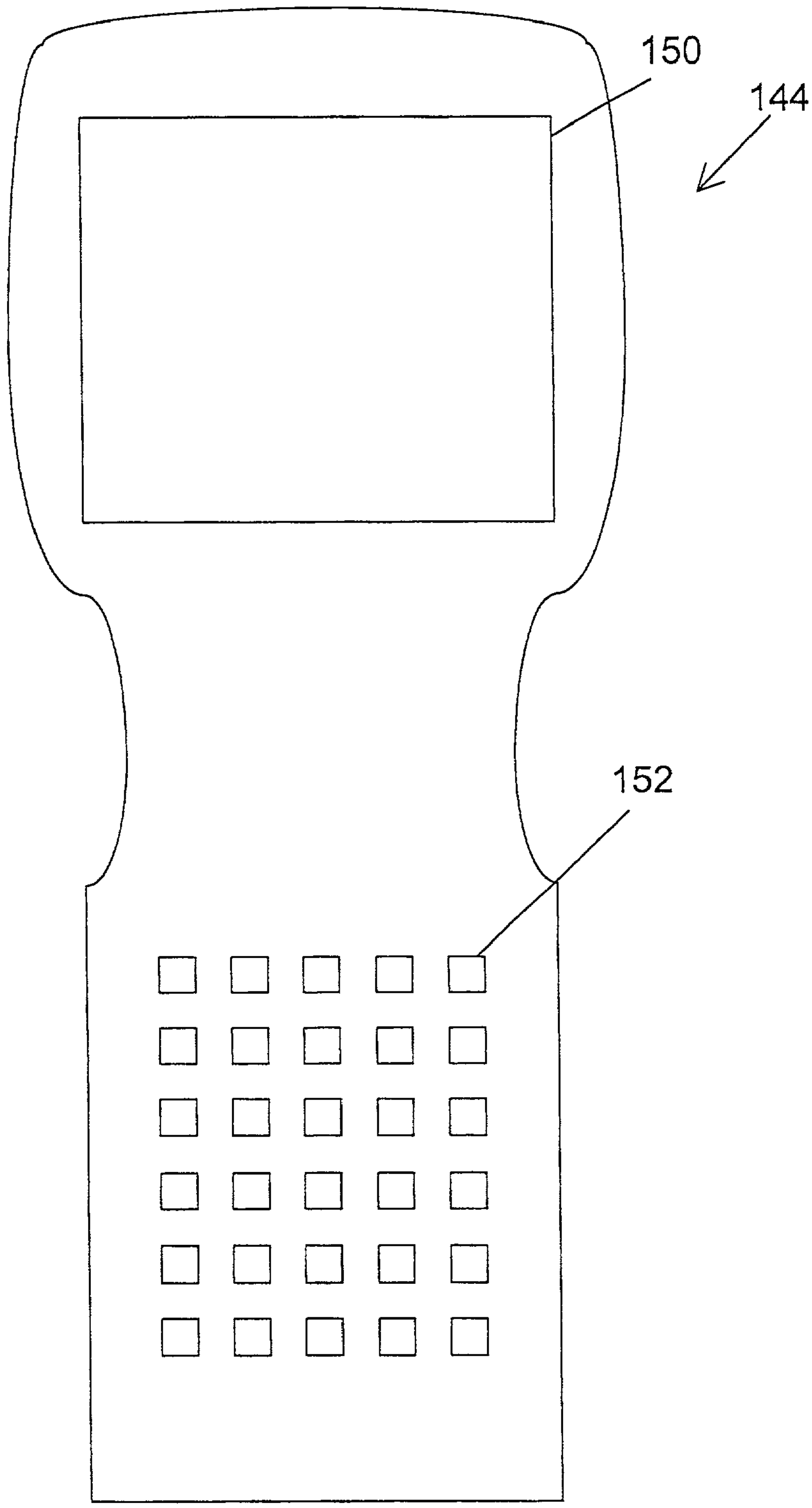
FIG. 2 is an external view of a versatile remote control unit for the present invention.

With reference to FIG. 2. the user interface 118 in the present invention consists of a user interface device 144, such as a remote controller, web-pad, Personal Digital Assistant (PDA), or any hand held consumer device with a touch pad screen. In the illustrated embodiment, the user interface device 144 comprises a versatile remote control unit (VRC) 144 that transmits and receives commands wirelessly to and from the set-top terminal 100. For example, the versatile remote control unit 144 typically would have an infrared (IR) signal emitter (not shown) that sends IR control signals to the set-top terminal 100. Once received, the IR commands are then processed by the central processing unit 104.

In one aspect of the present invention, the STT 100 includes a Versatile Remote Control Manager (VRCM) comprising a set of software and application programming interface (API) routines and associated drivers. These API's interface the VRCM with the applications that utilize the VRC key code re-mapping capability in conjunction with the versatile remote control unit 144. Preferably, the VRCM resides in the non-volatile memory of the CPU 104.

Referring now to FIG. 2, the versatile remote control unit 144 may include an integrated display 150 for soft key functions and a set of one or more fixed keys 152. However, it will be appreciated that the invention can be practiced with a VRC 144 that does not include the integrated display 150, but rather uses the user's television (not shown) to exercise the versatility feature of the VRC 144. The integrated display 150 is preferably a touch screen display of a type well known in the art for allowing a user to program the soft keys that are displayed on the display 150 for each application.

An example embodiment of using the remote control system of the invention is described below. First, the user selects the application, for example, via a menu, and then selects the configuration menu of the application. Then, the user selects the versatile remote configuration feature for the application. The application may respond in one of two of the following ways depending on whether the versatile remote control unit 144 has the integrated display 150.

In the first case where the versatile remote control unit 144 does not have the integrated display 150, the application displays a menu on the user's television display device showing the different possible functional key selections and guides the user to select a soft key for a given function (typically for those functions used most frequently). The application may facilitate this function for any customized sequence of frequently used soft keys. As part of the steps taken in the first case, the application uses the VRCM API's to map the versatile remote control unit 144 to the functions selected by the user.

In the second case where the versatile remote control unit 144 has the integrated display 150, the application first registers with the VRCM for future identification. Then, the application downloads the image corresponding to the configuration of the remapped soft keys to the versatile remote control unit 144. The download operation is achieved via the corresponding VRCM API's. The new configuration is visual only, i.e., the re-mapping appears to be different to the user, but the soft key code values remain the same although their function is based on the new definition that has been set by the application as instructed by the user. When the user then selects one of the re-mapped soft keys, a Receive VRCM driver routine forwards or conveys the key value to the application via the corresponding API. Then, the application takes action based on the associated function or set of functions assigned to the corresponding soft key. When multiple applications are taking advantage of the versatility feature of the VRCM task, the VRCM identifies the application by initially registering a corresponding identifier. One example for enabling identification of the application to the user is by providing an icon for each application on the integrated display 150. When the user switches between applications after the soft-keys have been configured, the corresponding application icon can be selected for identifying the associated application to the VRCM task. Subsequently, key selections can proceed as usual.

It will be appreciated that the user can map the fixed keys 152 of the versatile remote control unit 144 using the user's television or other display devices known in the art connected to the video/audio output 119 of the set-top terminal 100 in the same manner as the mapping of the soft keys displayed on the integrated display 150. The user's television can be used as a visual aid to facilitate the key re-mapping configuration function of the VRCM task. Once the configuration is complete, the user may perform the same procedure for configuring another application, and so on. The application, in conjunction with the VRCM task, has the ability to graphically show the mapping for each key by displaying the corresponding function associated with the application via a remote control image on the user's television. The remote control image can be accessible on the user's television any time the user needs to double-check the mapping of the function for each remapped key.

Alternatively in the second case, the user's television may show multiple icons, where one icon represents a single application. Once an icon is selected, the image on the user's television is updated to show the keys associated with that selected application represented by the selected icon. The user may alternate between the applications once all keys for all of the user-selected applications have been configured (one time configuration). Any time the user subsequently selects the application, and if the versatile remote control feature is turned on, then the VRCM is utilized to facilitate use of the re-mapping function.

Once the remapping configuration has been done for any selected application, normal use of the VRC 144 can commence in accordance with the following steps:

1. The user selects the application icon.
2. The user selects a given key associated with the application (soft key if the VRC 144 has the integrated display 150, otherwise a fixed key 152 that may represent the remapped key or indicate the corresponding icon on the user's television.
3. The VRCM associates the selected soft key with the selected application and forwards or conveys the selected soft key code to the application associated with the selected icon (in step 1), and uses the selected key code to determine whether the user wants to make another selection for the same application, then step 3 is repeated, or if the user wants to make a selection for another application, then steps 1–3 are repeated.

As described above, the VRCM comprising a set or group of software and application programming interface (API) routines resident in the set-top terminal 100 that are accessed by using one or more key of the VRC 144. When a user performs a keystroke of the VRC 144, the selected application remaps a corresponding function for the key to enable the user to map a variety of functions for each application using one or more keys of the VRC 144.

It should be known to those skilled in the art that this invention equally applies to any consumer device that may benefit from this capability, not just a set-top terminal device, and to any hand held device, not just a remote controller with or without an integrated touch screen display.

While the invention has been specifically described in connection with certain example embodiments thereof, it is to be understood that this is by way of illustration and not of limitation. The preceding description is intended to enable others skilled in the art to best utilize the invention in various embodiments and with various modifications as are suited to the particular use contemplated. It is intended that the scope of the invention be defined by the following claims.

What is claimed is:

1. A versatile user interface system, comprising:

a consumer device including a central processing unit having a memory for processing communication data;

at least one application resident in the consumer device;

a user interface device having at least one key for interfacing with the consumer device; and a plurality of software and application programming interface (API) routines resident in the memory of the consumer device, wherein at least one of the plurality of software and API routines forwards a key code to the at least one application, and wherein the at least one application remaps a corresponding key code function of the at least one key or a sequence of keys when the at least one key on the user interface device is selected by a user.

2. The versatile user interface system according to claim 1, wherein the plurality of software and API routines comprises a Versatile Remote Control Manager (VRCM).

3. The versatile user interface system according to claim 1, wherein the consumer device comprises one of a set-top terminal, a satellite receiver, a television, and any other functionally similar device.

4. The versatile user interface system according to claim 3, wherein the set-top terminal is connected to a CATV communication system.

5. The versatile user interface system according to claim 1, wherein the user interface device comprises one of a versatile remote control unit (VRC), a remote controller, a web-pad, a Personal Digital Assistant, and a hand-held device with a touch pad screen.

6. The versatile user interface system according to claim 5, wherein the versatile remote control unit includes a display for displaying at least one soft key generated by the VRCM for programming of the application using the VRCM.

7. The versatile user interface system according to claim 6, wherein the at least one soft key displays an application type to allow the VRCM to recognize that subsequent soft key selections correspond to the at least one application selected by the user.

8. The versatile user interface system according to claim 6, wherein the VRCM causes the display to show the mapping for the corresponding key code function associated with the at least one application.

9. The versatile user interface system according to claim 6, wherein the display displays a plurality of icons, one of the plurality of icons being associated with the at least one application.

10. A method for programming at least one application resident in a consumer device, comprising the steps of:

providing at least one application resident in a consumer device;

providing a plurality of software and application programming interface (API) routines resident in the consumer device; and sending control signals to the consumer device using a user interface device, whereby at least one of the plurality of software and API routines forwards a key code to the at least one application, and whereby the at least one application remaps a corresponding key code function of the at least one key or a sequence of keys when the at least one key on the user interface device is selected by a user.

11. The method of claim 10, wherein the plurality of software and API routines comprise a Versatile Remote Control Manager (VRCM).

12. The method according to claim 11, further including the step of using the VRCM to download and display a graphical representation of at least one soft key on a display device of a remote control unit.

13. The method according to claim 12, further including the step of displaying an icon on the display device that enables the VRCM to recognize that subsequent soft key selections by the user correspond to the at least one application represented by that icon.

14. The method according to claim 12, further including the step of displaying a mapping for each key, or sequence of keys, and the corresponding key code function associated with the at least one application.

15. The method according to claim 12, wherein the display device displays a plurality of icons, one of the plurality of icons being associated with the at least one application.

16. The method according to claim 11, wherein the VRCM interprets a key pressed by the user when no applications have registered with the VRCM.

17. The method according to claim 10, further including the step of connecting the set-top terminal to a CATV communication system.

18. A versatile user interface system, comprising:

a set-top terminal including a central processing unit for and memory for processing and storing communication data;

at least one application resident in the memory of the set-top terminal;

a versatile remote control unit having at least one key for sending control signals to the set-top terminal;

a Versatile Remote Control Manager (VRCM) resident in the memory of the set-top terminal, wherein the VRCM forwards a key code to the at least one application, and wherein the VRCM remaps a corresponding key code function for the at least one key or a sequence of keys when the at least one key is selected on the versatile remote control unit by a user.

19. The versatile user interface system according to claim 18, wherein the versatile remote control unit includes a display for displaying at least one soft key generated by the VRCM.

20. The versatile user interface system according to claim 18, wherein the at least one soft key displays an application type to allow the VRCM to recognize that subsequent soft key selections correspond to the at least one application selected by the user.

21. The versatile user interface system according to claim 18, wherein the VRCM causes the display to show the mapping for the corresponding key code function associated with the at least one application.

22. The versatile user interface system according to claim 18, wherein the versatile remote control unit displays a plurality of icons, one of the plurality of icons being associated with the at least one application.

23. The versatile user interface system according to claim 18, wherein the set-top terminal is connected to a CATV communication system.

24. A cable television system, comprising:

a set-top terminal including a central processing unit and memory for processing and storing communication data, the set-top terminal connected to a CATV communication system;

a display device operatively coupled to the set-top terminal;

at least one application resident memory of the set-top terminal;

a versatile remote control unit having at least one key for sending control signals to the set-top terminal to invoke the at least one application of the set-top terminal; and a plurality of software and application programming interface (API) routines resident in memory of the set-top terminal, wherein at least one of the plurality of software and API routines interact with the at least one application by forwarding a key code for the at least one application, and wherein the at least one application remaps a corresponding key code function for the at least one key or a sequence of keys on the versatile remote control unit when the at least one key on the versatile remote control unit is selected by a user.

25. The cable television system according to claim 24, wherein the plurality of software and API routines comprises a Versatile Remote Control Manager (VRCM).

26. A video system with a user interface including a remote control unit, said system comprising:

a device controlled using said remote control unit;

a display associated with said device; and said remote control unit comprising a plurality of keys;

wherein a function signaled by one or more of said plurality of keys on said remote control device can be selected and programmed by a user by selecting that function from a menu displayed on said display device.

27. The system of claim 26, wherein said device comprises a television and said display associated with said device comprises a screen of said television.

28. The system of claim 26, wherein said device comprises a set-top terminal and said display associated with said device comprises a television.

29. The system of claim 26, wherein:

said device is configured to execute any of a plurality of applications;

a user can select a particular application from said plurality of applications using said remote control unit; and functions signaled by one or more of said plurality of keys of said remote control unit are changed depending on the particular application the user has selected.

* * * * *